United States Patent
Epps et al.

(10) Patent No.: US 9,692,322 B2
(45) Date of Patent: Jun. 27, 2017

(54) INVERTER WITH IMPROVED SHOOT THROUGH IMMUNITY

(71) Applicant: GE AVIATION SYSTEMS LLC, Grand Rapids, MI (US)

(72) Inventors: Phillip Henry Richard Epps, Pompano Beach, FL (US); Andrew Benjamin Cole, Boca Raton, FL (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 0 days.

(21) Appl. No.: 15/024,900

(22) PCT Filed: Feb. 28, 2014

(86) PCT No.: PCT/US2014/019465
§ 371 (c)(1),
(2) Date: Mar. 25, 2016

(87) PCT Pub. No.: WO2015/047448
PCT Pub. Date: Apr. 2, 2015

(65) Prior Publication Data
US 2016/0218638 A1    Jul. 28, 2016

Related U.S. Application Data

(60) Provisional application No. 61/883,617, filed on Sep. 27, 2013.

(51) Int. Cl.
*H02M 1/32* (2007.01)
*H02M 7/537* (2006.01)
(Continued)

(52) U.S. Cl.
CPC .............. *H02M 7/537* (2013.01); *H02M 1/08* (2013.01); *H02M 1/38* (2013.01); *H03K 17/302* (2013.01); *H02M 2001/0009* (2013.01)

(58) Field of Classification Search
CPC .......... H02M 1/32; H02M 3/28; H02M 3/325; H02M 3/33569; H02M 3/315;
(Continued)

(56) References Cited

U.S. PATENT DOCUMENTS 4,126,819 A    11/1978 Stobbe et al.
5,481,219 A    1/1996 Jacobs
(Continued)

FOREIGN PATENT DOCUMENTS

JP    2006314154 A    11/2006

OTHER PUBLICATIONS

International Search Report and Written Opinion dated May 3, 2015 which was issued in connection with PCT Patent Application No. PCT/US14/019465 which was filed on Feb. 28, 2014.

*Primary Examiner* — Adolf Berhane
(74) *Attorney, Agent, or Firm* — GE Global Patent Operation; William S. Munnerlyn

(57) ABSTRACT

An inverter phase leg for a DC-AC inverter includes a high supply line and a low supply line across which a DC voltage is provided. A high side gate controlled switch is connected to the high supply line and a low side gate controlled switch is connected to the low supply line, with an output node between the high side switch and the low side switch. An inverting driver is connected to the high side gate controlled switch. The inverting driver's voltage source is configured in such a way as to hold the high side gate controlled switch off during the turn on cycle until the driver output has overcome the negative bias generated across the high side switch gate, producing high immunity to spurious turn on. A digital isolator is connected between the inverting driver and a control signal for switching the inverter phase leg. A differential transmitter and differential receiver may be used to further increase noise immunity.

13 Claims, 3 Drawing Sheets

(51) Int. Cl.
*H02M 1/38* (2007.01)
*H03K 17/30* (2006.01)
*H02M 1/08* (2006.01)
*H02M 1/00* (2006.01)

(58) Field of Classification Search
CPC ............ H02M 3/3155; H02M 7/5387; H02M 7/53871; H02M 7/33507; H02M 7/537
USPC ...... 363/16, 17, 56.01, 56.02, 56.04, 95, 97, 363/131, 132
See application file for complete search history.

(56) References Cited

U.S. PATENT DOCUMENTS

| | | | |
|---|---|---|---|
| 5,646,837 A | 7/1997 | Weggel | |
| 5,859,519 A | 1/1999 | Archer | |
| 6,909,620 B2 | 6/2005 | Park et al. | |
| 2001/0048278 A1 | 12/2001 | Young et al. | |
| 2004/0213026 A1 | 10/2004 | Park | |
| 2004/0227193 A1 | 11/2004 | Lee | |
| 2008/0218258 A1* | 9/2008 | Crawley | H03F 1/3211 330/10 |
| 2008/0290927 A1 | 11/2008 | Mazzola | |
| 2011/0292697 A1* | 12/2011 | Alexander | H02M 5/275 363/37 |
| 2012/0280573 A1* | 11/2012 | Ohkura | H02J 7/0016 307/80 |
| 2014/0133203 A1* | 5/2014 | Alexander | H02M 3/1582 363/124 |
| 2014/0233278 A1* | 8/2014 | Li | H02M 7/53873 363/37 |
| 2015/0003115 A1* | 1/2015 | Barron | H02M 1/08 363/17 |
| 2015/0061569 A1* | 3/2015 | Alexander | B60L 11/1809 320/101 |
| 2016/0043616 A1* | 2/2016 | Krishnamurthy | H01L 23/3675 310/64 |
| 2016/0079904 A1* | 3/2016 | Krishnamurthy | H02P 27/06 318/504 |
| 2016/0099665 A1* | 4/2016 | Chen | H02P 29/68 318/400.27 |

\* cited by examiner

INVERTER WITH IMPROVED SHOOT THROUGH IMMUNITY

CROSS-REFERENCE TO RELATED APPLICATION

This application is a national stage application under 35 U.S.C. §371(c) of prior filed, co-pending PCT application serial number PCT/US2014/019465, filed on Feb. 8, 2014, which claims priority to U.S. patent application Ser. No. 61/883,617, filed on Sep. 27, 2013. The above-listed applications are herein incorporated by reference.

BACKGROUND

Embodiments of the innovation pertain generally to the field of electrical power conversion and particularly to DC to AC inverters utilizing semiconductor switches.

Electrical power inverters typically utilize pairs of semiconductor switches that are connected together across a DC bus or supply lines to which a DC voltage source is connected. The switches are alternately turned on and off in a selected switching sequence to provide AC power to a load connected to a node between the two switches. The high side semiconductor switches are almost always selected to be n-type devices because of their superior switching characteristics and low on-resistance compared to p-type devices. As a result, the high side switch requires a floating voltage source and level-shift function that contributes to the cost and complexity of the inverter gate drive. A single pair of semiconductor switches connected in this manner may be used by itself to provide single phase AC power to a load, or two pairs of switches may be connected together in a conventional H-bridge configuration, for single phase power, three pairs of switches for three phase power, etc. Each pair of switches may be considered a phase leg of a single phase or multiphase inverter.

Dead time is almost always added to the gate drive signals provided to the two switches of a phase leg to ensure that one of the switches is completely turned off before the other switch is turned on. Otherwise, if both of the switches were turned on simultaneously, a short circuit current through the switches could burn out the switches or damage other circuit components because the two switches are connected in series across the DC bus lines. This condition is sometimes called "shoot through." However, the presence of dead time can add a significant amount of undesired non-linearity and harmonic distortion to output voltage waveforms. The output waveform distortion and voltage amplitude loss of the fundamental-frequency components becomes worse as either the fundamental frequency or the carrier frequency increases.

Different methods for compensating for dead time are known, including sensing current flow through the switches and ensuring the turn-off of a conducting switch before the other is turned on. See U.S. Pat. Nos. 4,126,819, 5,646,837 and 5,859,519 and published U.S. patent application US2001/0048278A1. Such circuits require significant additional components, with significant added cost, or still require delays between turn-off and turn-on of the switches with corresponding dead time. U.S. Pat. No. 6,909,620 has an output node between the two switches, with a series diode or connector switch between the output node and the low side switch, and the junction between the diode or connector switch and the low side switch electrically connected directly to the gate of the high side switch. If the low side switch is still conducting at the time that the high side switch receives a command to turn on, the gate of the high side switch will be biased so that the switch is held off until current stops flowing through the low side switch and, conversely, if the high side switch is still on at the time that the low side switch is turned on, the gate of the high side switch will be biased to insure its immediate turn-off, thereby preventing a condition under which the high side and low side switches are turned on at the same time.

Yet as the fast switching of the high speed switches occurs, the drain-gate capacitance creates a path for parasitic current to flow into the internal gate resistance, which causes a voltage spike on the gate, risking unwanted turn on, and a shoot through condition to possibly occur.

BRIEF DESCRIPTION

One aspect of the innovation relates to an inverter phase leg comprising a high supply line and a low supply line across which a DC voltage may be provided. The inverter leg includes a high side gate controlled switch connected to the high supply line and a low side gate controlled switch connected to the low supply line. The switches are connected between the high supply line and the low supply line with an output node between the high side switch and the low side switch. An inverting driver is connected to the high side gate controlled switch and has an input voltage from a control signal, an output voltage for switching the high side gate controlled switch, and a driving voltage. A source of first DC voltage is provided between the output node and the inverting driver. The driving voltage is set to cause the output voltage of the inverting driver to be zero until the input voltage exceeds the first DC voltage, thereby preventing a shoot through condition caused by uncontrolled activation of the high side gate controlled switch.

DETAILED DESCRIPTION

In the background and the following description, for the purposes of explanation, numerous specific details are set forth in order to provide a thorough understanding of the technology described herein. It will be evident to one skilled in the art, however, that the exemplary embodiments may be practiced without these specific details. In other instances, structures and devices are shown in diagram form in order to facilitate description of the exemplary embodiments.

Figure 1:
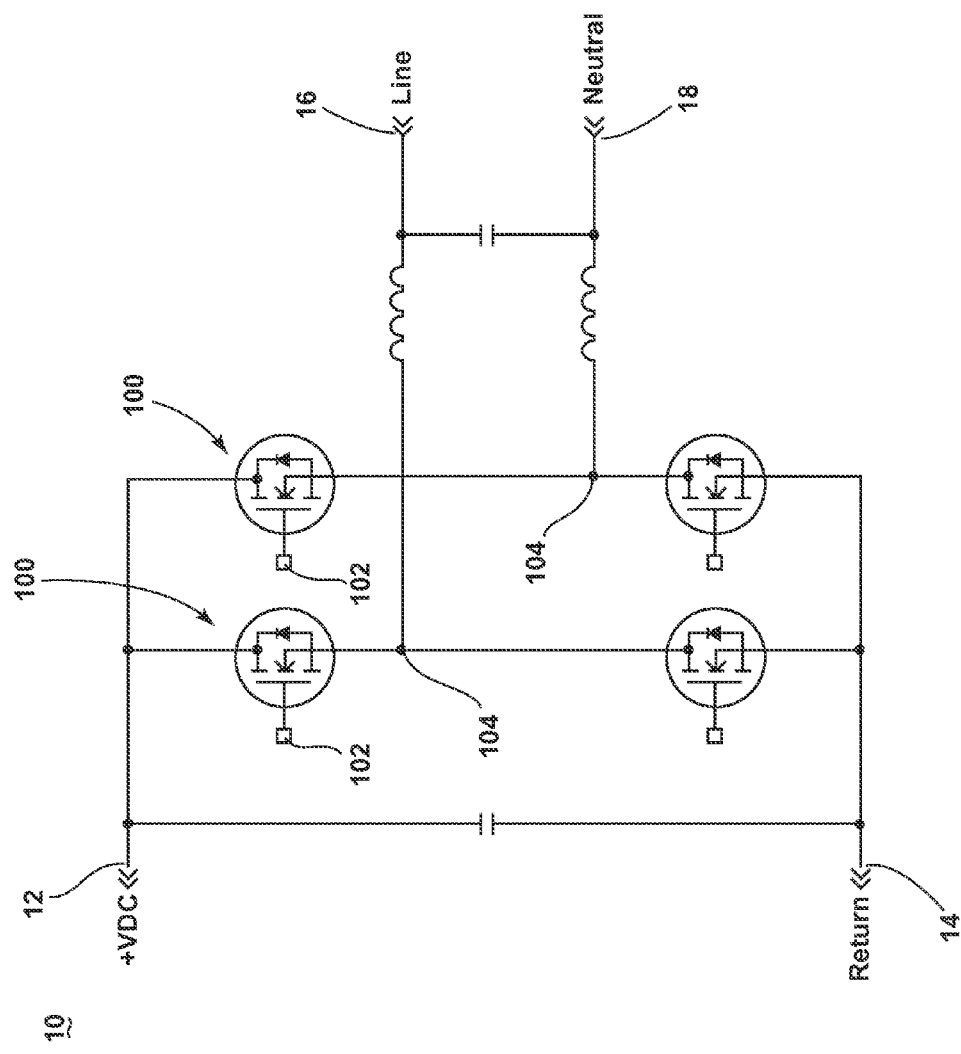
FIG. 1 is a schematic of a single phase DC to AC inverter.

FIG. 1 is a schematic of a single phase DC to AC inverter 10 of the type in which the innovation may be practiced. The DC to AC inverter 10 includes a high side supply line 12 shown as a +VDC source and a low side supply line 14 shown as a ground or return. Both supply lines 12, 14 are supplied with power from a DC power supply (not shown) that is configured to provide an appropriate DC output voltage across the supply lines 12, 14. The DC to AC inverter 10 further includes a pair of inverter phase legs 100, each inverter phase leg having two gate controlled semiconductor switches connected in series across the supply lines 12, 14. The two gate controlled semiconductor switches may be insulated gate bipolar transistors (IGBTs) or power MOSFETs, or bipolar transistors, or the like. An output node 104 between the two gate controlled semiconductor switches in one inverter phase leg 100 is connected to an output line 16 on which the AC output voltage of the DC to AC inverter 10 is provided. A second output node 104 between the two gate controlled semiconductor switches in another inverter phase leg 100 is connected to an output line 18 which serves as a neutral line for the AC output voltage. A gate drive line 102 connects the gate input of each of the high side gate controlled semiconductor switches to an inverting driver (not shown in FIG. 1) in accord with the innovation as explained below.

Figure 2:
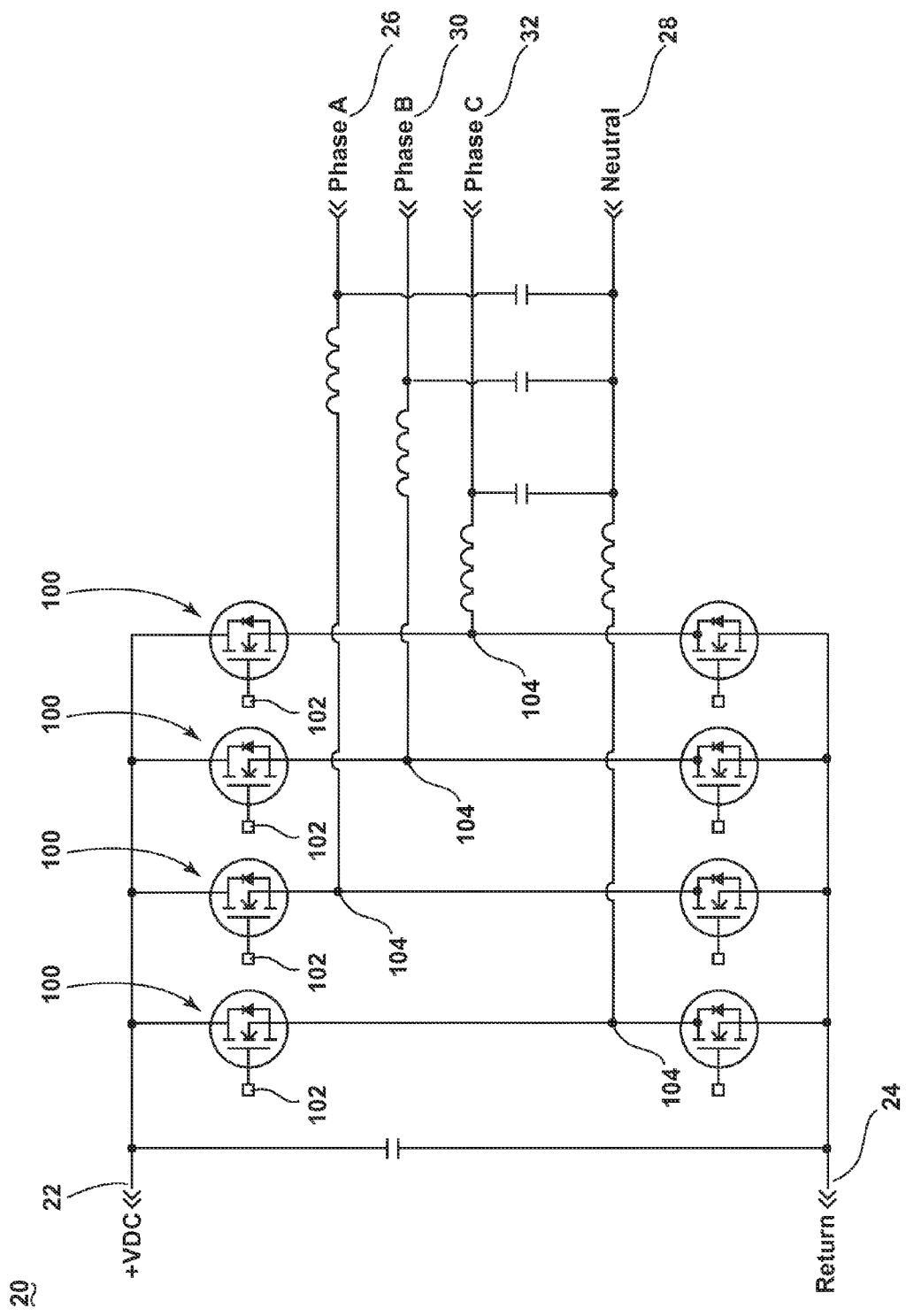
FIG. 2 is a schematic of a three phase DC to AC inverter.

FIG. 2 is a schematic of a three phase DC to AC inverter 20 of the type in which the innovation may be practiced. The DC to AC inverter 20 includes a high side supply line 22 shown as a +VDC source and a low side supply line 24 shown as a ground or return. Both supply lines 22, 24 are supplied with power from a DC power supply (not shown) that is configured to provide an appropriate DC output voltage across the supply lines 22, 24. The DC to AC inverter 20 further includes four inverter phase legs 100, each inverter phase leg having two gate controlled semiconductor switches connected in series across the supply lines 22, 24. The two gate controlled semiconductor switches may be insulated gate bipolar transistors (IGBTs) or power MOSFETs, or bipolar transistors, or the like. An output node 104 between the two gate controlled semiconductor switches in each inverter phase leg 100 is connected to an output line 26, 28, 30, and 32, respectively. Three of the lines 26, 30, and 32 provide the three voltage phases of the three phase AC output voltage and one of the lines 28 provides a neutral. A gate drive line 102 connects to the gate input of each high side gate controlled semiconductor switch.

The gate drive line 102 carries a one bit signal out of a controlling device (not shown in FIGS. 1 and 2). This signal must traverse board traces, cabling, and other components to get to the high speed gate controlled semiconductor switches, all of which results in noise, transient voltages, and parasitic currents. Consequently, electrical isolation between the switches and the control circuitry is desired. Also, with many systems, the duty cycles can vary from 0 to 100%. Such a wide window of duty cycles makes conventional gate drive transformers ineffective as isolation barriers.

Figure 3:
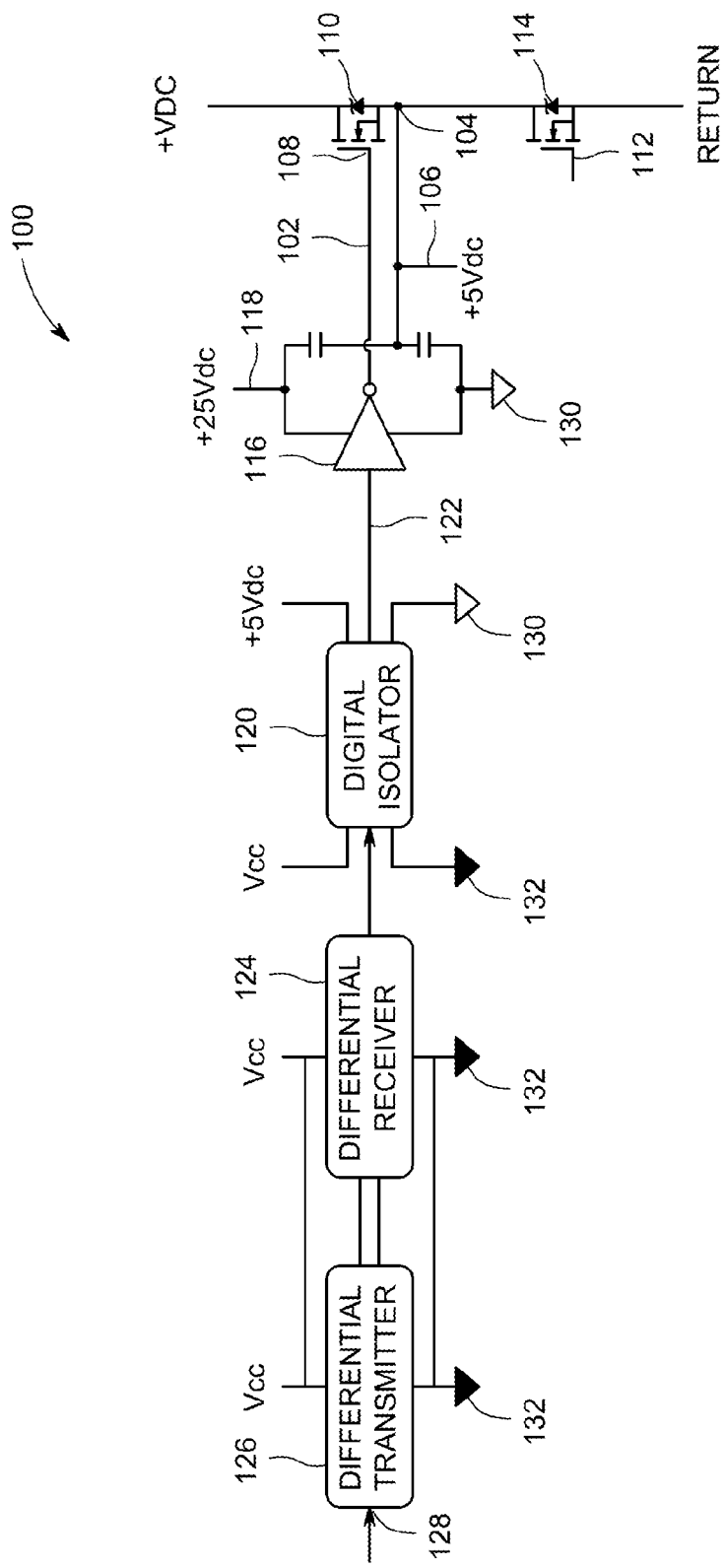
FIG. 3 is a schematic of an isolation circuit for any one of the phase legs in the inverters of FIGS. 1 and 2.

FIG. 3 is a schematic of an inverter phase leg 100 according to the innovation as might be used in a DC to AC inverter 10, 20 of FIGS. 1 and 2. The phase leg 100 comprises a high side supply line +VDC and a low side supply line return across which a DC voltage may be provided. A high side gate controlled switch 110 with a gate 108 is connected to the high supply line, and a low side gate controlled switch 114 with a gate 112 is connected to the low supply line. An output node 104 between the gate controlled switches 110, 114 is connected to the output voltage as shown in FIGS. 1 and 2.

Some isolation may be provided by a differential transmitter 126 and a differential receiver 124 which receive a gate drive signal 128 from a controller (not shown). A differential transmitter 126 and a differential receiver 124 are beneficial when transmitting the gate drive signal 128 over distances. Even though capacitive coupling throughout the system during the switching of the gate controlled switches 110, 114 can couple noise into the circuitry or wiring, the fact that the signals are differential provides a good level of immunity, allowing good signal integrity to be kept.

Further isolation may be provided by a high speed digital isolator 120 that can effectively maintain the resolution of the gate drive signal 128. Nevertheless, some capacitive coupling into the output line 122 from the isolator 120 may still cause spurious transient switching of the gate controlled switches 110, 114. The problem primarily occurs on the high side gate controlled switch 110, due to the potential of its source operating between zero and full input voltage. When the high side gate controlled switch 110 turns off, its source flies down. Capacitive coupling into the isolator's internal secondary resistance causes the isolator's output voltage to go up. This tendency of the isolator output line 122 to go up from zero would cause the voltage at the gate 108 to tend upwards, which can turn on the high side gate controlled switch 110 before the low side gate controlled switch 114 turns completely off, causing shoot through, especially as the system input voltage grew higher.

The problem is completely eliminated by an inverting driver 116 between the isolator 120 and the high side gate controlled switch 110 to modulate the gate drive signal 128. More particularly, a driving voltage for the inverting driver 116 provides a modulation range for the gate drive signal 128 of 25V from a lower DC voltage at 130 of −5V to an upper DC voltage at 118 of +20V. The lower and upper DC voltages 130, 118 can be supplied by two independent regulated power supplies (not shown), or a single 25V supply. More particularly, the output node 104 supplies a biasing DC voltage 106 to the driving voltage that to ensure the lower and upper DC voltages 130, 118 balance themselves correctly. Using the same DC supply from the node 104 that is used for the logic level signals of the gate controlled switches 110, 114 ensures that the high side gate controlled switch 110 is well biased off before the gate driver becomes active, one means of such is to use this logic level power to control a switch (not shown) between the source of the driver's voltage and the Inverting Driver power pins which will be held off until the logic voltage reaches a level near its steady state regulation level.

This negative bias voltage across the gate drive line 102 when the high side gate controlled switch 110 is off prevents harmful transient-induced turn-on by increasing the amount of spurious voltage that must be generated in order to turn on the high side gate controlled switch 110 improperly. This structure, in turn, allows the high side gate controlled switch 110 to be switched at the highest speeds possible. The negative bias also helps to turn off the high side gate controlled switch 110 harder during normal operation.

This written description uses examples to disclose the innovation, including the best mode, and also to enable any person skilled in the art to practice the innovation, including making and using any devices or systems and performing any incorporated methods. The patentable scope of the innovation is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An inverter phase leg in a DC to AC converter comprising a high supply line and a low supply line across which a DC voltage may be provided, a high side gate controlled switch connected to the high supply line and a low side gate controlled switch connected to the low supply line, the switches connected between the high supply line and the low supply line with an output node between the high side switch and the low side switch, comprising:

an inverting driver connected to the high side gate controlled switch and having an input voltage from a control signal, an output voltage for switching the high side gate controlled switch, and a driving voltage; and a source of a constant biasing first DC voltage between the output node and the inverting driver;

wherein the driving voltage is set to cause the output voltage of the inverting driver to be zero until the input voltage exceeds the first DC voltage.

2. The inverter phase leg of claim 1 further comprising a source of second DC voltage to the inverting driver.

3. The inverter phase leg of claim 2 wherein the driving voltage includes the second DC voltage and the first DC voltage.

4. The inverter phase leg of claim 1 wherein the first DC voltage is set to positive.

5. The inverter phase leg of claim 1 further comprising a digital isolator connected between the inverting driver and the control signal.

6. The inverter phase leg of claim 5 further comprising a differential receiver and a differential transmitter connected to the digital isolator.

7. An AC-DC inverter including the inverter phase leg of claim 1.

8. The inverter phase leg of claim 2 wherein the first DC voltage is set to positive.

9. The inverter phase leg of claim 3 wherein the first DC voltage is set to positive.

10. The inverter phase leg of claim 2 further comprising a digital isolator connected between the inverting driver and the control signal.

11. The inverter phase leg of claim 3 further comprising a digital isolator connected between the inverting driver and the control signal.

12. The inverter phase leg of claim 4 further comprising a digital isolator connected between the inverting driver and the control signal.

13. An inverter phase leg in a DC to AC converter comprising a high supply line and a low supply line across which a DC voltage may be provided, a high side gate controlled switch connected to the high supply line and a low side gate controlled switch connected to the low supply line, the switches connected between the high supply line and the low supply line with an output node between the high side switch and the low side switch, comprising:

an inverting driver connected to the high side gate controlled switch and having an input voltage from a control signal, an output voltage for switching the high side gate controlled switch, and a driving voltage including a high driving voltage that is a positive voltage and a low driving voltage that is a negative voltage; and a source of first DC voltage between the output node and the inverting driver;

wherein the driving voltage is set to cause the output voltage of the inverting driver to be the low driving voltage until the input voltage exceeds the first DC voltage.

* * * * *